United States Patent
Gretz (10) Patent No.: US 9,831,648 B1
(45) Date of Patent: Nov. 28, 2017

(54) COVER ASSEMBLY FOR FLOOR BOX INSTALLED IN CONCRETE POUR AREAS

(71) Applicant: Arlington Industries, Inc., Scranton, PA (US)

(72) Inventor: Thomas J. Gretz, Delray Beach, FL (US)

(73) Assignee: ARLINGTON INDUSTRIES, INC., Scranton, PA (US)

(*) Notice: Subject to any disclaimer, the term of this patent is extended or adjusted under 35 U.S.C. 154(b) by 0 days.

(21) Appl. No.: 15/186,497

(22) Filed: Jun. 19, 2016

Related U.S. Application Data (60) Provisional application No. 62/182,442, filed on Jun. 20, 2015.

(51) Int. Cl.
  *H02G 3/08* (2006.01)
  *H05K 5/02* (2006.01)

(52) U.S. Cl.
  CPC .............. *H02G 3/081* (2013.01); *H02G 3/088* (2013.01); *H05K 5/0226* (2013.01)

(58) Field of Classification Search
  CPC .......... H02G 3/081; H02G 3/08; H02G 3/086; H02G 3/14; H02G 3/18; H02G 3/185; H02G 3/088; H05K 5/0226
  See application file for complete search history.

(56) References Cited

U.S. PATENT DOCUMENTS

| | | | |
|---|---|---|---|
| 4,044,908 A | 8/1977 | Dauberger | |
| 4,054,222 A | 10/1977 | Suk | |
| 6,179,634 B1 * | 1/2001 | Hull | H02G 3/185 174/485 |
| 6,265,662 B1 | 7/2001 | Riedy et al. | |
| 6,450,353 B1 | 9/2002 | Riedy et al. | |
| 6,840,785 B2 * | 1/2005 | Drane | H01R 13/5213 16/382 |
| 7,078,616 B2 | 7/2006 | Roesch et al. | |
| 7,193,160 B2 | 3/2007 | Dinh | |
| 7,301,100 B2 | 11/2007 | Drane | |
| 7,319,193 B2 | 1/2008 | Halterman | |
| 7,459,632 B2 | 12/2008 | Bowman | |
| 7,511,231 B2 | 3/2009 | Drane et al. | |
| 7,635,110 B2 * | 12/2009 | Galasso | H02G 3/185 174/483 |
| 7,726,662 B2 | 6/2010 | Foster | |
| 8,052,008 B2 | 11/2011 | Drane et al. | |
| 8,119,912 B2 | 2/2012 | Thibault et al. | |
| 8,759,676 B1 | 6/2014 | Gretz | |
| 8,921,695 B2 | 12/2014 | Drane | |
| 8,921,712 B1 | 12/2014 | Gretz | |
| 9,236,723 B2 | 1/2016 | Scanzillo et al. | |

(Continued)

*Primary Examiner* — Timothy Thompson
*Assistant Examiner* — Amol Patel (57) ABSTRACT

A cover assembly for providing a moisture resistant installation of a receptacle or similar electrical component within a floor box and flush with a newly poured concrete floor surface. The cover assembly includes a floor box, a leveling ring, a mounting plate, and a cover plate with a flip-lid hinged to the cover plate. Sealing means are provided integral with the cover plate for sealing against the floor surface and for sealing the flip-lid to the cover plate to provide a moisture resistant installation of the receptacle. The sealing means includes a lid gasket integral with the flip-lid and a plate gasket integral with the cover plate.

11 Claims, 12 Drawing Sheets

(56) References Cited

U.S. PATENT DOCUMENTS

| | | | |
|---|---|---|---|
| 2004/0123997 A1* | 7/2004 | Drane | H02G 3/088 174/67 |
| 2009/0014196 A1* | 1/2009 | Peck | H02G 3/185 174/54 |
| 2009/0218128 A1* | 9/2009 | Carbone | H02G 3/0493 174/486 |
| 2012/0231657 A1* | 9/2012 | Bouse | H02G 3/185 439/535 |
| 2013/0192869 A1* | 8/2013 | Drane | H05K 5/03 174/67 |
| 2014/0000956 A1* | 1/2014 | Wurms | H02G 3/08 174/535 |
| 2016/0365714 A1* | 12/2016 | Galasso | H02G 3/085 |

* cited by examiner

COVER ASSEMBLY FOR FLOOR BOX INSTALLED IN CONCRETE POUR AREAS

CROSS-REFERENCE TO RELATED APPLICATIONS

This application claims priority to provisional U.S. Application No. 62/182,442 filed Jun. 20, 2015, the contents of which are incorporated herein by reference in their entirety.

FIELD OF THE INVENTION

The present invention relates to the installation of electrical components and more specifically to a flip-lid cover assembly for an electrical box.

BACKGROUND OF THE INVENTION

Electrical floor boxes or cans for concrete pour areas are typically used to provide electrical service, such as a duplex outlet, in an area which will be covered with concrete. After the concrete is poured, the top of the floor box may not be level with the concrete surface as a result of the pressure created by the surrounding concrete. For any cover installed over the concrete surface, it is highly desirable that the cover be installed flush with the concrete surface, and that it seals the wiring cavity of the floor box against moisture when the outlets are not in use, and that it may be configure to allow access to the electrical outlets when so desired.

Accordingly, there is a need for a cover assembly for a floor box that enables an installer to rapidly and with minimal effort install an electrical component in such a way that the component is moisture resistant to protect the electrical component mounted within the floor box. The cover assembly should provide a cost-effective means of installing a receptacle in a floor box flush with the floor surface in a moisture resistant installation.

BRIEF SUMMARY OF THE INVENTION

The present invention is a cover assembly for providing a moisture resistant installation of a receptacle or similar electrical component within a floor box and flush with a newly poured concrete floor surface. The cover assembly includes a floor box, a leveling ring, a mounting plate, and a cover plate with a flip-lid hinged to the cover plate. Sealing means are provided integral with the cover plate for sealing against the floor surface and for sealing the flip-lid to the cover plate to provide a moisture resistant installation of the receptacle. The sealing means includes a lid gasket integral with the flip-lid and a plate gasket integral with the cover plate.

BRIEF DESCRIPTION OF THE SEVERAL VIEWS OF THE DRAWING(S)

Reference is made herein to the accompanying drawings, which are not necessarily drawn to scale, and wherein.

DETAILED DESCRIPTION

Figure 1:
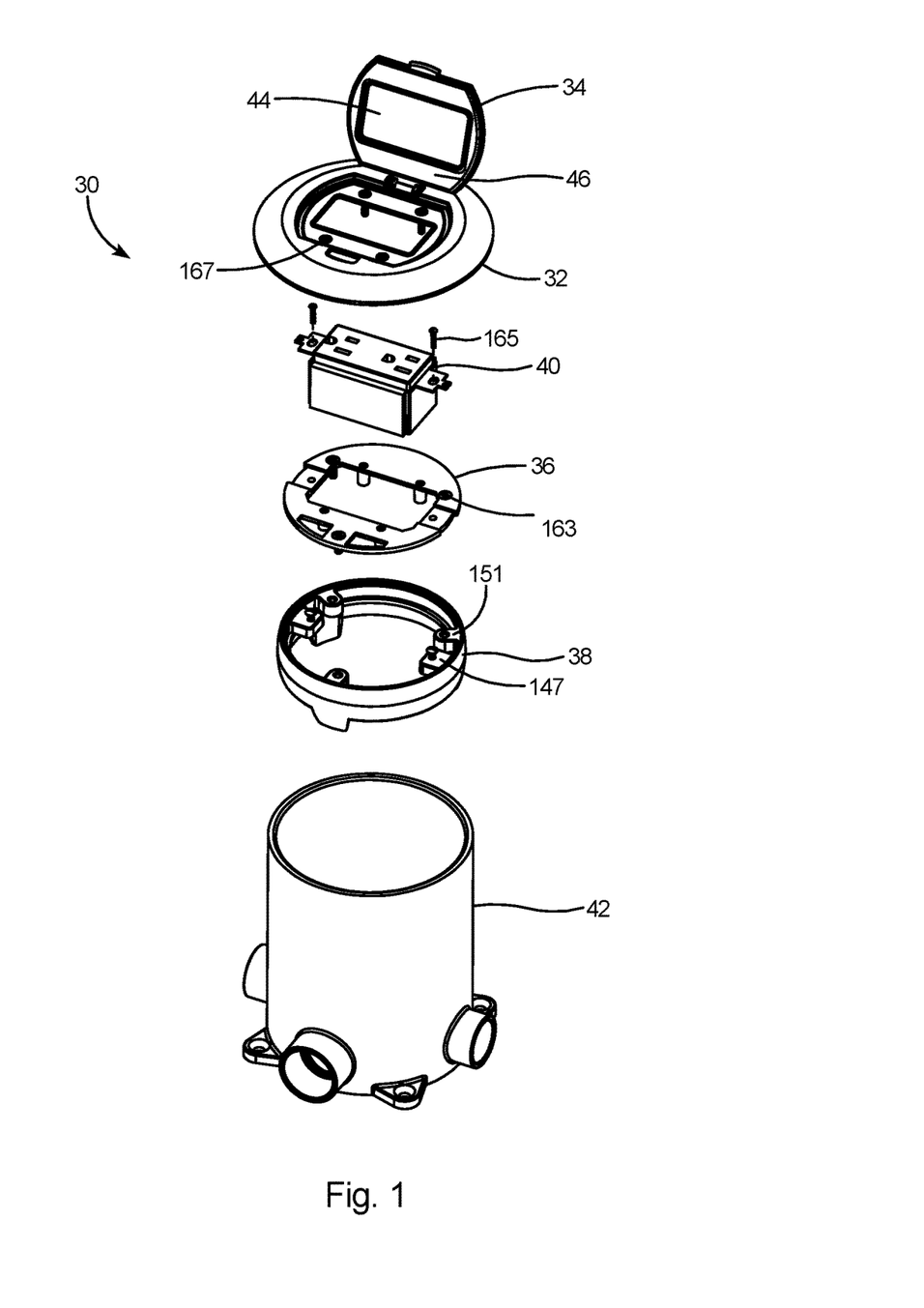
FIG. 1 is an exploded isometric view of a cover assembly for a concrete floor box assembly in accordance with embodiments of the invention.
Figure 2:
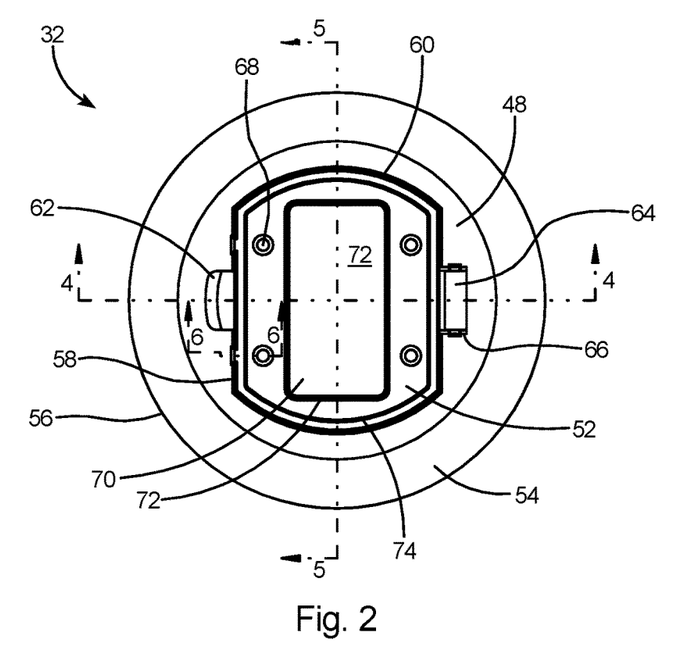
FIG. 2 is a top view of a cover plate that forms a portion of the cover assembly of FIG. 1.

The present invention is a cover assembly for a concrete floor box. As shown in FIG. 1, the cover assembly 30 includes a cover plate 32, a flip-lid 34, and a mounting plate 36. The cover assembly 30 is used in conjunction with a leveling ring 38 to mount an electrical component 40 into a floor box 42. The inside surface 44 of the flip-lid 34 includes a lid gasket 46 thereon.

With reference to FIGS. 2-7, the cover plate 32 includes a top surface 48 and a bottom surface 50. The top 48 of the cover plate 32 includes a recessed area 52 and a peripheral flange 54 extending outward from the recessed area to an outer edge 56. The recessed area 52 includes flat edges 58 and arcuate edges 60. The top 48 of the cover plate 32 further includes a tab accommodating recess 62, two indents 63, and a hinge accommodating recess 64 extending from each of the flat edges 58. The hinge accommodating recess 64 includes two end walls 66. Apertures 68 are provided in the recessed area 52. The cover plate 32 further includes an opening 70, a raised edge 72 on the periphery of the opening 70, and a raised edge 74 interior of the outer edge 56 of the recessed area 52. The lid gasket is integral with the flip-lid and, when installed to the floor box 42 will provide a moisture resistant seal against the recessed area 52 and raised edge 74 of the flip-lid 34.

Figure 3:
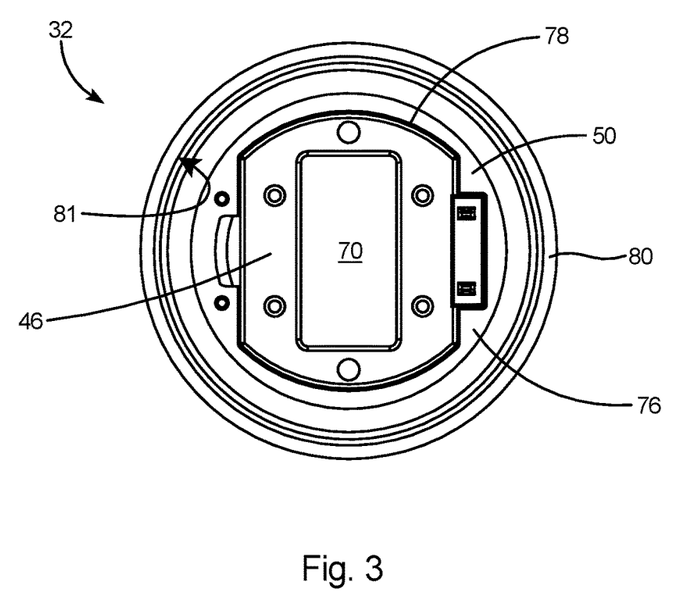
FIG. 3 is a bottom view of the cover plate.
Figure 4:
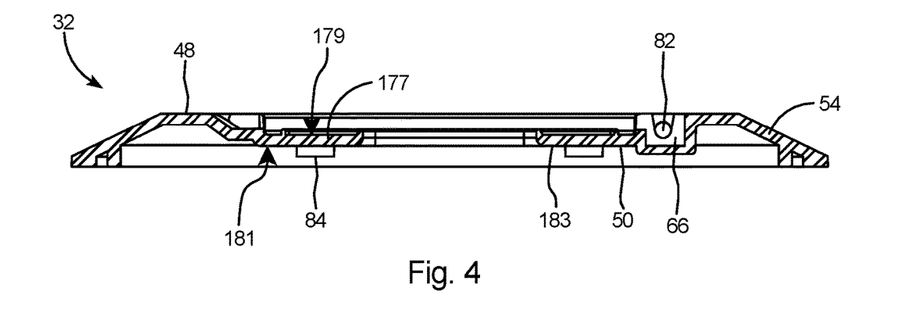
FIG. 4 is a sectional view of the cover plate taken along line 4-4 of FIG. 2.
Figure 5:
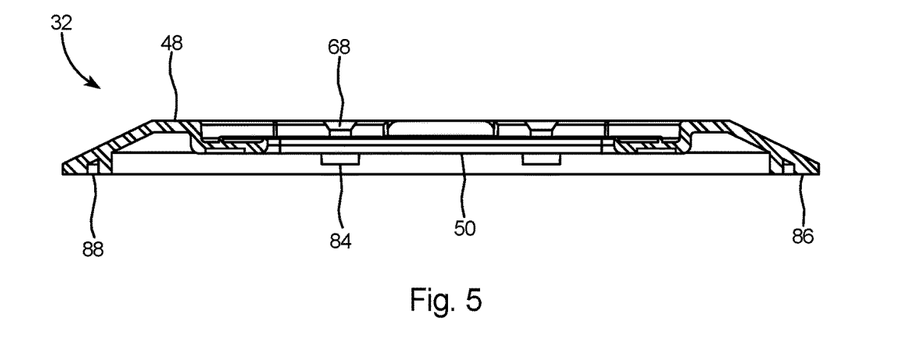
FIG. 5 is a sectional view of the cover plate taken along line 5-5 of FIG. 2.

With reference to FIG. 3, the bottom surface 50 of the cover plate 32 includes a recessed area 76 having an outer edge 78 and a plate gasket 80 integral with the outer edge of the cover plate. With reference to FIG. 4, when the cover plate is affixed to a floor box 42 according to the present invention, plate gasket 80 has an inner periphery 81 that is greater than the diameter than the diameter of the floor box 42 (see FIG. 1) and plate gasket 80 will provide a moisture resistant seal against the floor surface.

Figure 6:
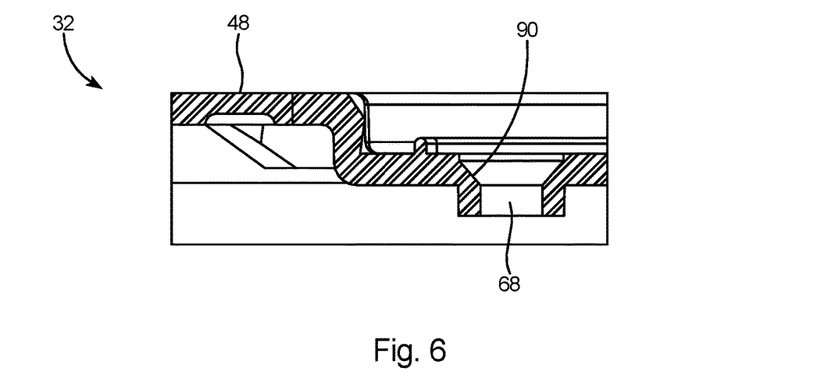
FIG. 6 is a sectional view of the cover plate taken along line 6-6 of FIG. 2.
Figure 7:
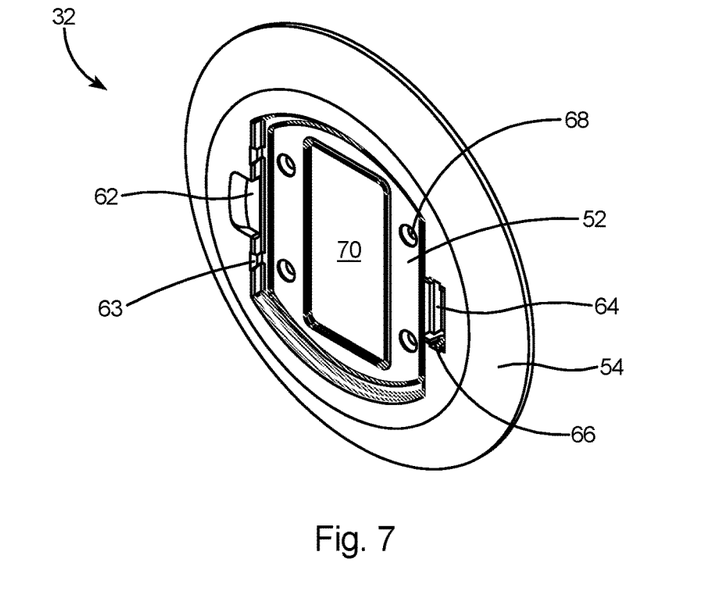
FIG. 7 is a top isometric view of the cover plate.
Figure 8:
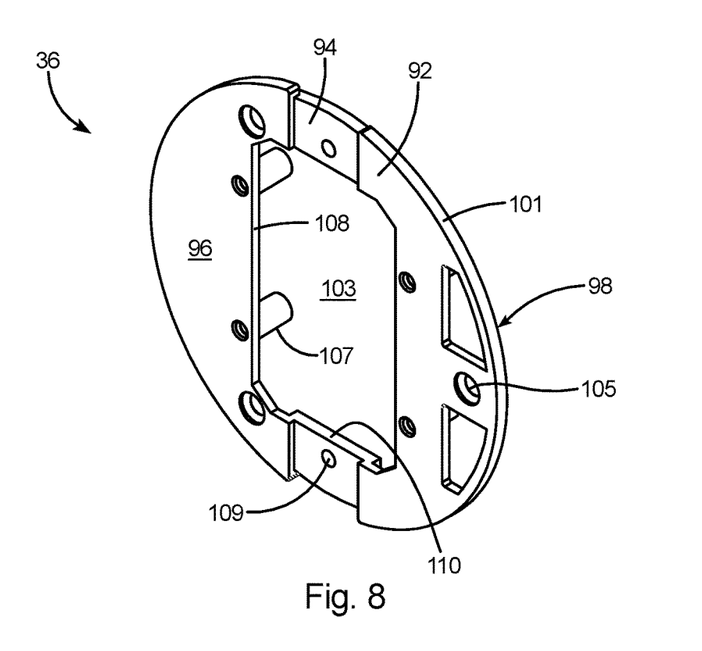
FIG. 8 is an isometric view of a mounting plate that forms a portion of the cover assembly of FIG. 1.
Figure 9:
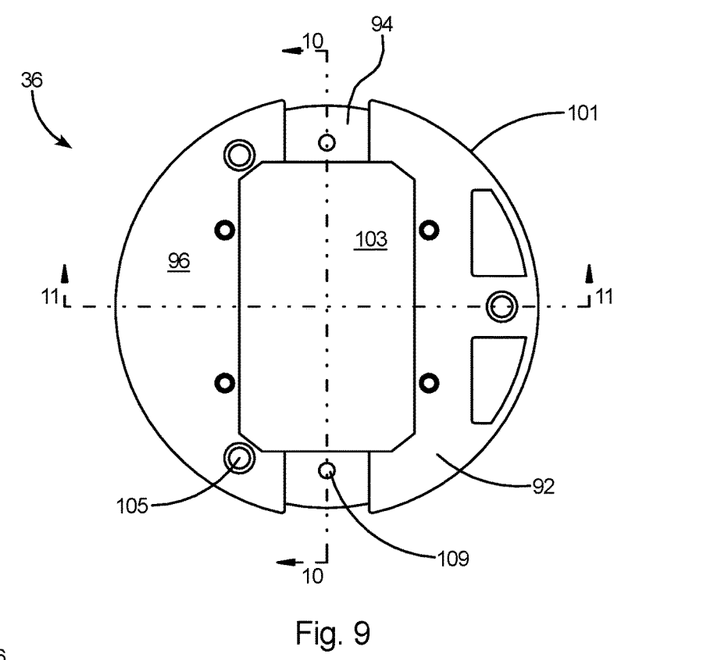
FIG. 9 is a top view of the mounting plate.
Figure 10:
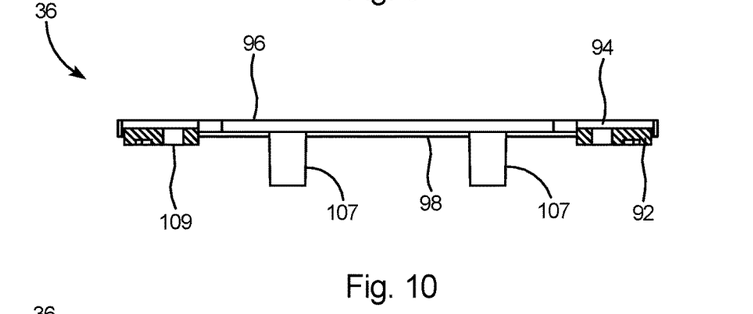
FIG. 10 is a sectional view of the mounting plate taken along line 10-10 of FIG. 9.
Figure 11:
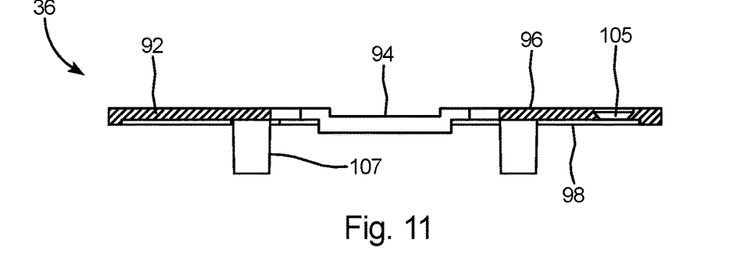
FIG. 11 is a sectional view of the mounting plate taken along line 11-11 of FIG. 9.

As shown in FIG. 4, the end walls 66 of hinge accommodating recess 64 each include a bore 82 therein, the bores being in axial alignment. A peripheral wall 84 extends from the bottom surface 50 around each of the apertures 68. The bottom surface 50 includes a flat outer periphery 86 having a groove 88 therein. Apertures 68 preferably include a chamfered periphery 90 as shown in FIG. 6.

Referring to FIGS. 7-11, mounting plate 36 includes a plate body portion 92 and two recessed areas 94 therein. The main body portion 92 includes an upper surface 96, a lower surface 98, an outer periphery 101, and an opening 103 therein. Upper surface 96 of mounting plate 36 includes one or more countersunk apertures 105 near the outer periphery. A plurality of internally threaded bosses 107 extend from the lower surface 98 and are positioned around the opening 103. An aperture 109 is provided in each recessed area 94 of the mounting plate. Mounting plate opening 103 is defined by two sides 108 and two ends 110. The recessed areas 94 are at the ends 110 of the opening 103.

Figure 16:
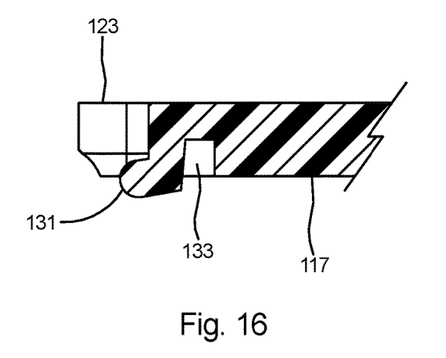
FIG. 16 is a sectional view of the flip-lid taken along line 16-16 of FIG. 12.
Figure 17:
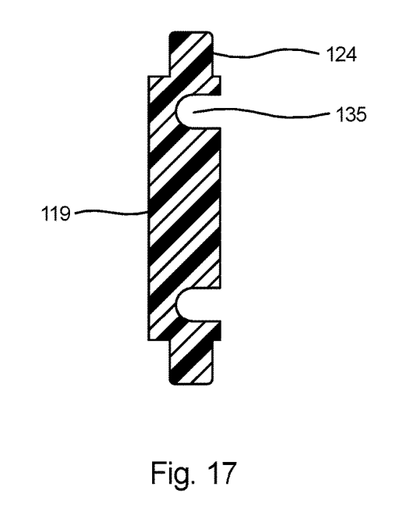
FIG. 17 is a sectional view of the flip-lid taken along line 17-17 of FIG. 12.
Figure 18:
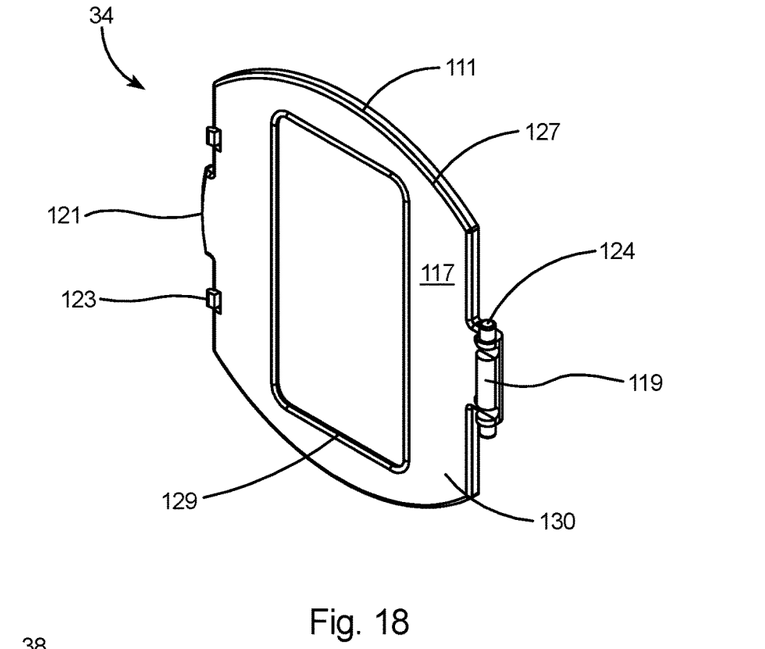
FIG. 18 is an isometric view of the flip-lid.

With reference to FIGS. 12-17, flip-lid 34 includes two arcuate sides 111, two flat sides 113, a top surface 115, and a bottom surface 117. A hinge 119 extends from one flat side and a thumb tab 121 and two locking tabs 123 extend from the opposing flat side 113. Hinge 119 includes two end posts 124. Flip-lid 34 further includes an outer periphery 125. The bottom surface 117 of the flip-lid includes an outer raised edge 127 near the outer periphery 125 and an inner raised edge 129 interior of the outer periphery. Outer raised edge 127 and inner raised edge 129 define a recess 130 on the bottom of the flip lid. As shown in FIG. 16, the locking tabs 123 include a nose portion 131 and a groove 133 in the bottom surface 117 of the flip-lid 34. As shown in FIG. 17, hinge 119 includes a groove 135 adjacent each of the end posts 124. Locking tabs 123 provide a means of snap-engagement and locking of flip-lid 34 to cover plate 32 as pressing of flip-lid onto cover plate causes locking tabs 123 to snap into indents 63 (see FIG. 7).

Figure 23:
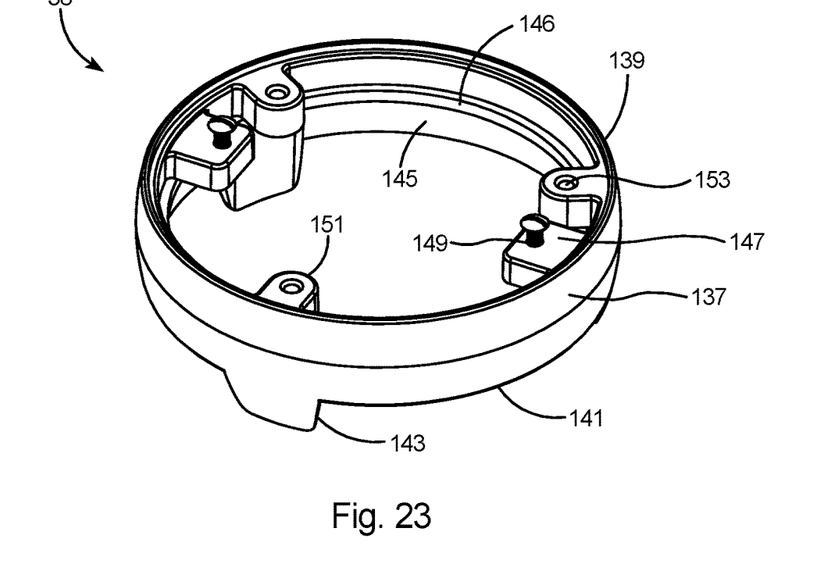
FIG. 23 is an isometric view of a leveling ring that forms a portion of the cover assembly of FIG. 1.

Referring to FIG. 23, the leveling ring 38 includes a ring body 137 having a top edge 139, a bottom edge 141, and one or more tabs 143 extending from the bottom edge. The leveling ring 38 includes an inner periphery 145, a collar 146, and two component arms 147 extending from the inner periphery at substantially 180° apart on the ring. Each component arm 147 includes a bore 149 therein. Three mounting arms 151 extend from the inner periphery 145 of the ring body 137. Each mounting arm 151 includes a mounting bore 153 therein.

Figure 19:
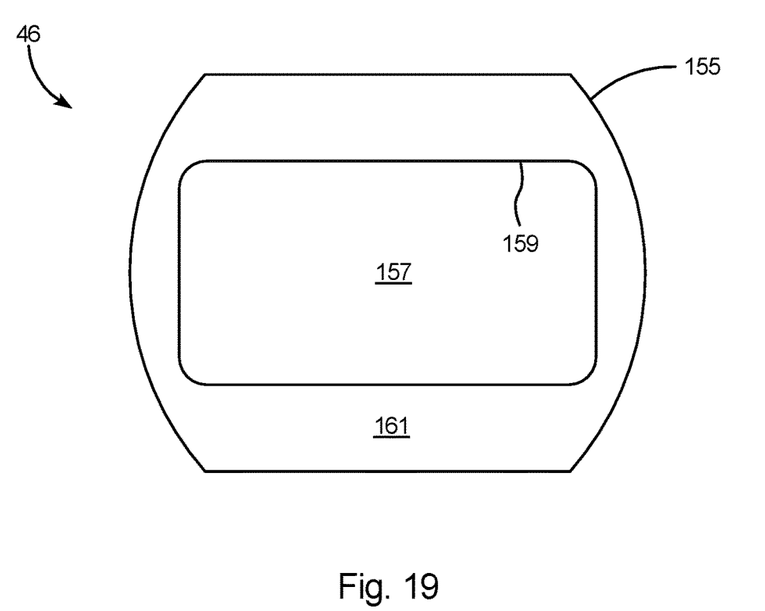
FIG. 19 is a top view of a gasket that forms a portion of the cover assembly of FIG. 1.
Figure 20:
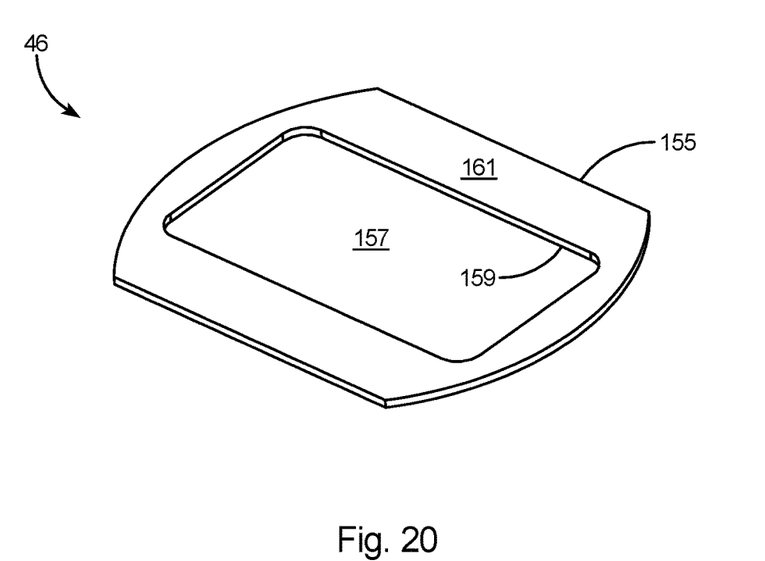
FIG. 20 is an isometric view of the gasket.

With reference to FIGS. 19 and 20, lid gasket 46 is a substantially flat member having an outer periphery 155 and an opening 157 therein. Opening 157 defines an inner periphery 159 on the lid gasket. The outer periphery 155 of lid gasket 46 is adapted to fit within the outer raised edge 127 of the flip-lid 34 (see FIG. 1). The inner periphery 159 of the lid gasket is adapted to fit around the inner raised edge 129 of the flip-lid. The lid gasket 46 includes a flat upper surface 161 that is adapted to seat flush against the bottom surface 117 of the flip-lid 34.

Figure 21:
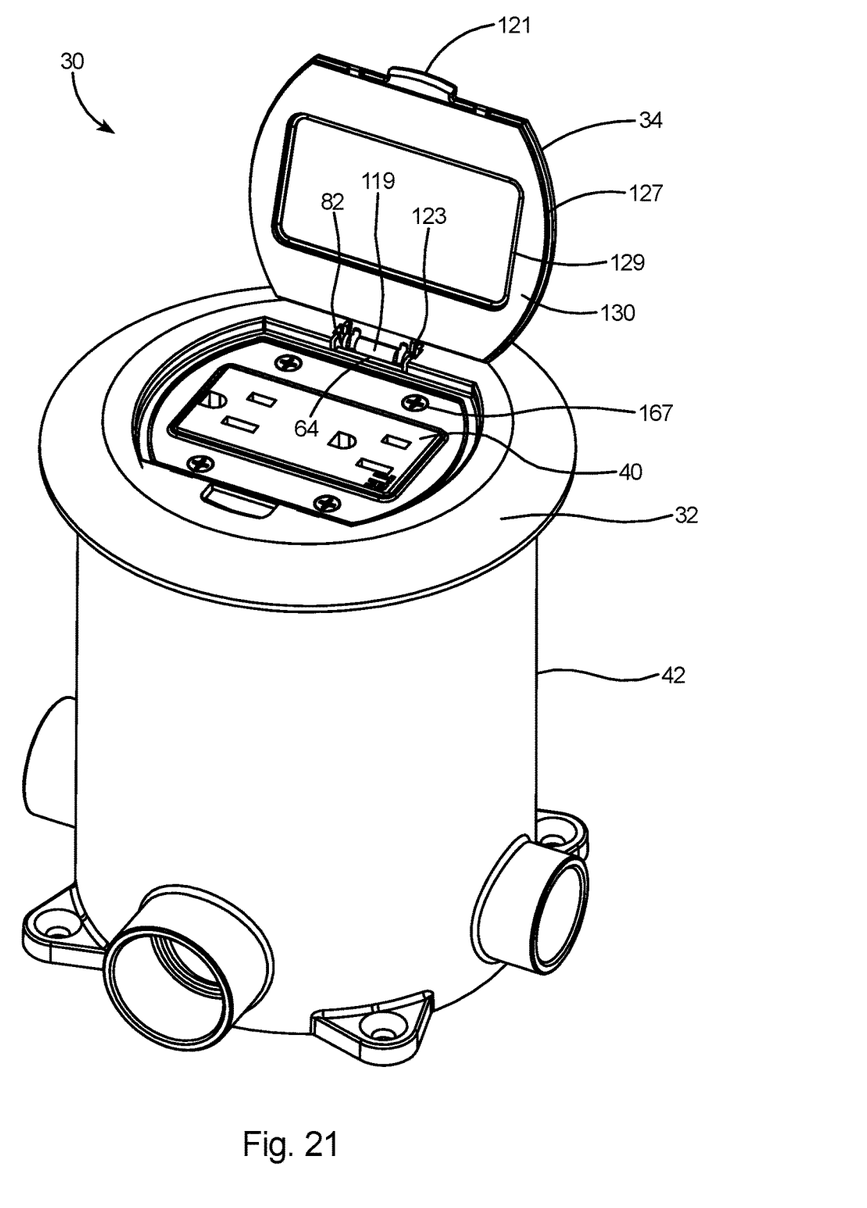
FIG. 21 is an isometric view of the cover assembly assembled to a concrete floor box with the flip-lid raised.
Figure 24:
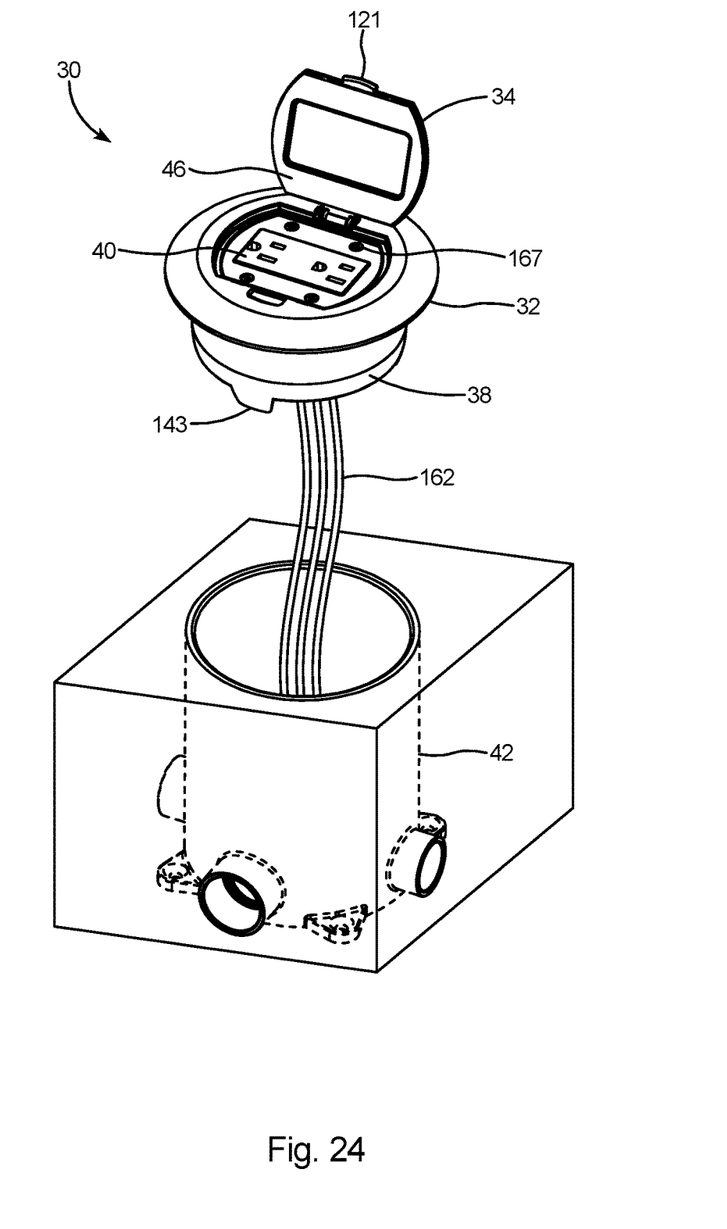
FIG. 24 is an isometric view of the cover assembly and leveling ring assembled together and in alignment to be installed in a concrete floor box.

Referring to FIG. 21, the cover assembly 30 is used to mount an electrical component 40, such as the duplex receptacle shown in FIG. 21, into a floor box or can 42. The floor box 42 is typically secured to a surface and concrete (not shown) is poured around the box. Leveling ring 38 (see FIG. 1) is then secured within the box 42 by adhesive applied around the outer periphery of the ring. Wiring connections 162 (see FIG. 24) are completed between the electrical component 40 and the supply voltage. Mounting plate 36 (see FIG. 1) of cover assembly 30 is then secured to the leveling ring 38 by fasteners 163 driven into mounting arms 151 (see FIG. 23) of leveling ring. Fasteners 165 are used to secure electrical component 40 to component arms 147 of mounting plate 36 as shown in FIG. 1. As shown in FIG. 1, floor box 42 includes a sidewall 171 with an inner surface 173 defining an enclosure 175 therein.

Figure 22:
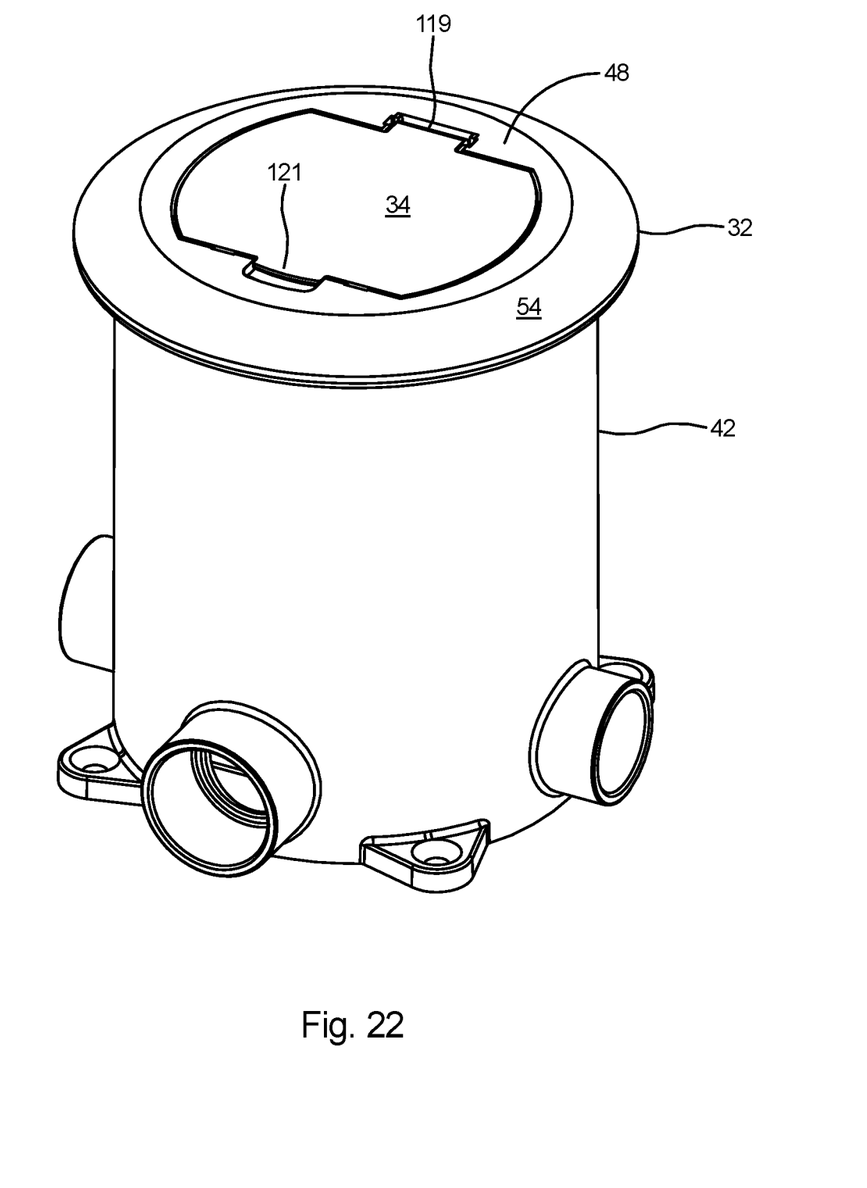
FIG. 22 is an isometric view of the cover assembly assembled to a concrete floor box with the flip-lid closed.

As shown in FIG. 21, cover plate 32 is then secured to mounting plate 36 by fasteners 167. Flip-lid 34 is hinged to cover plate 32 by end posts 124 extending into the bores 82 (see FIG. 4) in the end walls 66 of hinge accommodating recess 64 (see FIG. 2) in cover plate. As shown in FIG. 22, flip-lid 34 may be closed on cover plate 32 when the electrical component therein is not in use to shield the electrical component from moisture, insects, dust, or other contaminants. As shown in FIG. 22, flip-lid 34 when closed is flush with the top surface 48 of cover plate 32.

Figure 12:
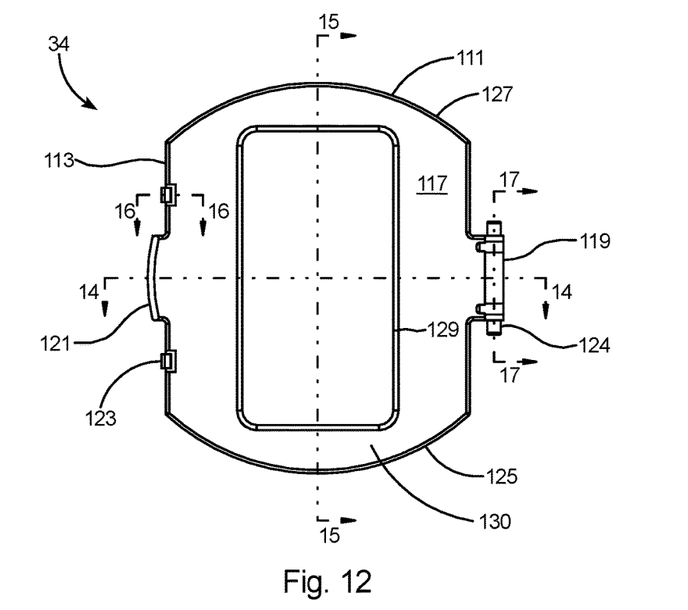
FIG. 12 is a bottom view of a flip-lid that forms a portion of the cover assembly of FIG. 1.
Figure 13:
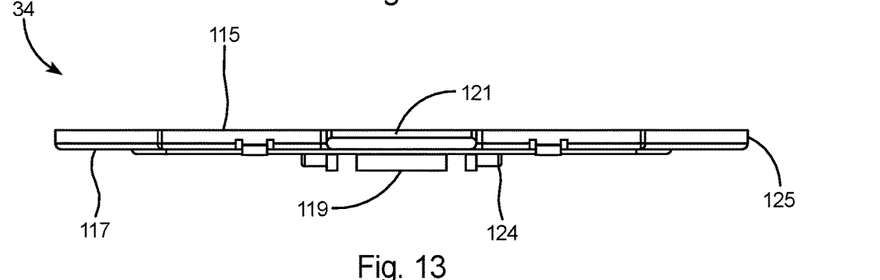
FIG. 13 is a side view of the flip-lid.
Figure 14:
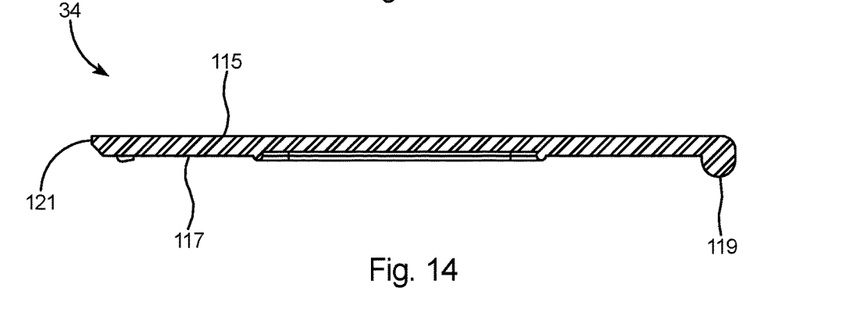
FIG. 14 is a sectional view of the flip-lid taken along line 14-14 of FIG. 12.
Figure 15:
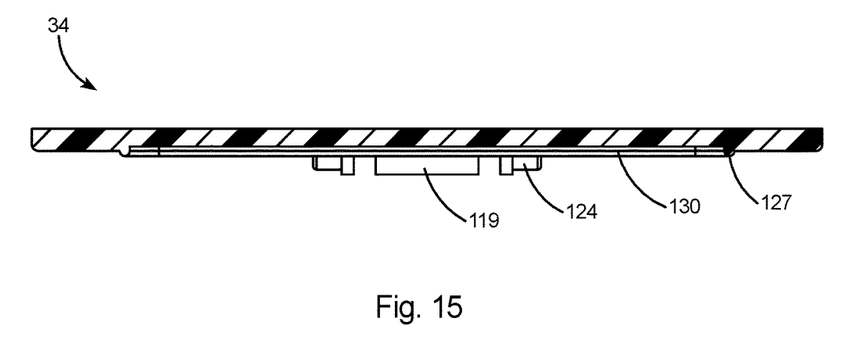
FIG. 15 is a sectional view of the flip-lid taken along line 15-15 of FIG. 12.

Referring to FIG. 4, the cover plate 32 further includes a recessed planar center portion 177 having a top surface 179, and a bottom surface 181. Peripheral flange 54 extends downward from the recessed planar center portion 177 of the cover plate. The peripheral flange 54 combines with the recessed planar center portion to define the recess 76 on the bottom 183 of the cover plate 32. As shown in FIG. 1, the flip-lid 34 is hinged to the recessed planar center portion of the cover plate. As shown in FIG. 12, the recessed area 130 on bottom of flip lid 34 includes the lid gasket 46 integral with the recessed area of the flip-lid.

The cover plate 32, flip-lid 34, and mounting plate 36 portions of the cover assembly 30 may be constructed of metal or plastic. Most preferably, the cover plate 32, flip-lid 34, and mounting plate 36 are each molded of plastic in one piece. Suitable plastics may include polyvinyl chloride (PVC) and polycarbonate. Lid gasket 46 and plate gasket 80 are preferably constructed of closed cell sponge rubber.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A cover assembly for an electrical floor box, comprising:
    a floor box with sidewalls defining an enclosure;
    a leveling ring configured to support an electrical receptacle in the floor box;
    said leveling ring including a ring body having an opening, an inner periphery defining said opening, a top edge, a bottom edge, and a tab extending from the bottom edge at the outer periphery of the leveling ring;
    a collar extending around the inner periphery of the leveling ring;
    a cover plate including an opening and a flip-lid hinged to said cover plate;
    a recessed area surrounding said flip lid;
    a lid gasket integral with said recessed area of said flip-lid; and a mounting plate secured against said collar and within said inner periphery of said leveling ring.

2. The cover assembly of claim 1, further comprising:
a peripheral flange on said cover plate; and
a plate gasket integral with the peripheral flange of the cover plate.

3. The cover assembly of claim 1, further comprising:
a mounting arm on said leveling ring; and
a component arm on said leveling ring.

4. The cover assembly of claim 1, further comprising:
an opening in said mounting plate; and
recessed areas in said mounting plate, said recessed areas on opposing sides of said mounting plate opening.

5. The cover assembly of claim 1, further comprising:
two flat sides on said flip-lid; and
a hinge on a first of said flat sides of said flip-lid and a thumb tab on a second of said flat sides of said flip-lid.

6. The cover assembly of claim 5, further comprising two locking tabs on said second of said flat sides of said flip-lid.

7. The cover assembly of claim 5, further comprising:
a groove and an end post on said hinge.

8. The cover assembly of claim 7, further comprising a hinge accommodating recess extending from said recessed planar center portion of said flip-lid.

9. The cover assembly of claim 1, further comprising:
an outer raised edge and an inner raised edge on said flip-lid; and
said outer raised edge and said inner raised edge defining said recess area on said flip lid.

10. The cover assembly of claim 1, further comprising:
locking tabs on said flip-lid; and
indents on said cover plate, said locking tabs and said indents enabling snap-engagement of said flip-lid to said cover plate.

11. The cover assembly of claim 1, further comprising:
a recessed area in said cover plate; and
a raised edge extending from said recessed area of said cover plate, said raised edge of said cover plate providing a moisture resistant seal of said gasket of said flip-lid against said cover plate.

\* \* \* \* \*